United States Patent
Kim

(10) Patent No.: US 9,401,391 B2
(45) Date of Patent: Jul. 26, 2016

(54) ORGANIC LIGHT-EMITTING DIODE (OLED) DISPLAY AND FABRICATION METHOD FOR THE SAME

(71) Applicant: Samsung Display Co., Ltd., Yongin, Gyeonggi-do (KR)

(72) Inventor: Tae-Kon Kim, Yongin (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 0 days.

(21) Appl. No.: 14/577,893

(22) Filed: Dec. 19, 2014

(65) Prior Publication Data

US 2015/0194625 A1 Jul. 9, 2015

(30) Foreign Application Priority Data

Jan. 7, 2014 (KR) .................. 10-2014-0001675

(51) Int. Cl.
*H01L 51/52* (2006.01)
*H01L 27/32* (2006.01)
*H01L 51/56* (2006.01)

(52) U.S. Cl.
CPC ........ *H01L 27/3258* (2013.01); *H01L 27/3223* (2013.01); *H01L 51/5246* (2013.01); *H01L 2251/566* (2013.01)

(58) Field of Classification Search
CPC ... H01L 51/524; H01L 27/3223; H01L 51/56; H01L 27/3258
USPC .............................................. 257/40; 438/28
See application file for complete search history.

(56) References Cited

U.S. PATENT DOCUMENTS

| 2003/0094615 A1* | 5/2003 | Yamazaki ............... H01L 27/12 257/72 |
| 2009/0218932 A1 | 9/2009 | Wang |
| 2009/0308105 A1 | 12/2009 | Pastel et al. |
| 2012/0181553 A1* | 7/2012 | Ono ..................... H01L 27/3246 257/88 |
| 2012/0313128 A1 | 12/2012 | Yokoyama et al. |

FOREIGN PATENT DOCUMENTS

| KR | 10-2011-0030541 A | 3/2011 |
| KR | 10-2011-0072131 A | 6/2011 |
| KR | 10-2012-0137264 A | 12/2012 |

* cited by examiner

*Primary Examiner* — Walter H Swanson
(74) *Attorney, Agent, or Firm* — Knobbe, Martens, Olson & Bear, LLP

(57) ABSTRACT

An organic light-emitting diode (OLED) display and fabrication method for the same are disclosed. In one aspect, the OLED display includes a first substrate including a display area and a non-display area surrounding the display area, wherein the non-display area includes first and second non-display areas and a second substrate formed over the first substrate. The OLED display also includes a dummy electrode formed in the non-display area, an insulating layer formed over the dummy electrode, and a sealant substantially sealing the first and second substrates and formed over the insulating layer in the non-display area. The insulating layer has at least one first through-hole and at least one second through-hole respectively formed in the first and second non-display areas. The sealant is at least partially filled in the first and second through-holes so as to directly contact the dummy electrode.

9 Claims, 7 Drawing Sheets

ORGANIC LIGHT-EMITTING DIODE (OLED) DISPLAY AND FABRICATION METHOD FOR THE SAME

RELATED APPLICATIONS

This application claims priority to and the benefit of Korean Patent Application No. 10-2014-0001675, filed on Jan. 7, 2014, in the Korean Intellectual Property Office, the entire contents of which are incorporated herein by reference in their entirety.

BACKGROUND

1. Field

The described technology generally relates to an organic light-emitting diode (OLED) display and a fabrication method for the same.

2. Description of the Related Technology

Organic light-emitting diode (OLED) displays are flat panel displays in which an organic emission layer is formed between opposing electrodes. Electrons injected from one of the electrodes are recombined with holes injected from the other electrode in the organic emission layer. Molecules included in the organic emission layer are excited due to the recombination and when the excited molecules return to a ground state they emit energy in the form of light.

OLED displays have excellent visibility and can be manufactured to be lightweight and have a thin profile. In addition, OLED displays have low power consumption. Accordingly, OLED displays are regarded as next-generation displays due in part to the above favorable characteristics.

SUMMARY OF CERTAIN INVENTIVE ASPECTS

One inventive aspect is an organic light emitting display having a substantially uniform sealing width and a fabricating method for the same.

Another aspect is an OLED display including a display panel separated in the form of one cell on a mother substrate including a plurality of display panels, wherein the display panel includes a first substrate configured to include a display area and a non-display area formed at the periphery of the display area, a second substrate joined together with the first substrate on one area including the display area, a sealing means configured to seal the first and second substrates, and a dummy electrode formed below the sealing means with an insulating layer interposed therebetween, wherein the insulating layer includes first and second through-holes through which portions of the dummy electrode are exposed so that the dummy electrode and the sealing means are directly contacted with each other.

The dummy electrode may form a closed loop to surround the display area in the non-display area.

The first and second through-holes may have different sizes from each other.

The size of the first through-hole may be greater than that of the second through-hole.

The second through-hole may be formed corresponding to the area in which the plurality of display panels are cut in the form of one cell on the mother substrate in the non-display area.

The first through-hole may be formed in an area except the area in which the second through-hole is formed in the non-display area.

Another aspect is a method for fabricating an OLED display including a display panel separated in the form of one cell on a mother substrate including a plurality of display panels, the method including defining a display area and a non-display area of each display panel on the mother substrate, forming a driving device for driving the display panels in the display area of each display panel and forming a dummy electrode in the non-display area of each display panel, forming an insulating layer patterned to include first and second through-holes through which portions of the dummy electrode are exposed in each display panel, and a third through-hole through which a portion of the driving device is exposed, forming an organic light emitting diode electrically coupled to the driving device through the third through-hole on the insulating layer of each display panel, joining a sealing substrate opposite to the mother substrate together with the mother substrate, and performing heat treatment by irradiating laser onto a sealing means applied on the first and second through-holes of the two substrates joined together.

The method may further include performing additional heat treatment by irradiating laser onto the sealing means applied on the second through-hole and cutting the two substrates joined together for each cell.

The dummy electrode may form a closed loop to surround the display area in the non-display area.

The first and second through-holes may have different sizes from each other.

The size of the first through-hole may be greater than that of the second through-hole.

The second through-hole may be formed corresponding to the area in which the plurality of display panels are cut in the form of one cell on the mother substrate in the non-display area of each display panel.

The first through-hole may be formed in an area except the area in which the second through-hole is formed in the non-display area of each display panel.

Another aspect is a method for fabricating an OLED display, the method including providing a first substrate including a display area in which an organic light emitting diode is formed and a non-display area formed at the periphery of the display area, forming a dummy electrode in the non-display area of the first substrate, forming an insulating layer patterned to include first and second through-holes through which portions of the dummy electrode are exposed on the first substrate including the dummy electrode, applying a sealing means overlapping the first and second through-holes on the non-display area, joining a second substrate opposite to the first substrate together with the first substrate, performing a first heat treatment by irradiating laser onto the sealing means applied between the first and second substrates, and performing a second heat treatment by irradiating laser onto the sealing means overlapping the second through-hole.

The dummy electrode may form a closed loop to surround the display area in the non-display area.

The first and second through-holes may have different sizes from each other.

The size of the first through-hole may be greater than that of the second through-hole.

The second through-hole may be formed corresponding to the area in which the plurality of display panels are cut in the form of one cell on the mother substrate in the non-display area.

The first through-hole may be formed in an area except the area in which the second through-hole is formed in the non-display area.

Another aspect is an OLED display including a first substrate including a display area and a non-display area surrounding the display area, wherein the non-display area includes first and second non-display areas, a second substrate formed over the first substrate, a dummy electrode formed in the non-display area, an insulating layer formed over the dummy electrode, and a sealant substantially sealing the first and second substrates and formed over the insulating layer in the non-display area, wherein the insulating layer has at least one first through-hole and at least one second through-hole respectively formed in the first and second non-display areas and wherein the sealant is at least partially filled in the first and second through-holes so as to directly contact the dummy electrode.

The dummy electrode can form a closed loop surrounding the display area. The first and second through-holes can have different sizes from each other. The area of a cross-section of the first through-hole can be greater than that of the second through-hole. At least one second through-hole can include a plurality of second through holes and the second through-holes can be formed along a side of the first substrate. The first and second non-display areas can be formed on opposing sides of the first substrate.

Another aspect is a method for fabricating an OLED display, the method including providing a mother substrate including a plurality of OLED display panels, wherein each of the OLED display panels includes a display area and a non-display area and wherein each of the non-display areas includes first and second non-display areas, forming a thin film transistor (TFT) in the display area of each of the OLED display panels, forming a dummy electrode in the non-display area of each of the OLED display panels, forming an insulating layer over the TFT and the dummy electrode in each of the OLED display panels, forming at least one first through-hole and at least one second through-hole in the insulating layer in each of the OLED display panels so as to expose portions of each of the dummy electrodes, wherein the first and second through-holes are respectively formed in the first and second non-display areas, forming a third through-hole in the insulating layer in each of the OLED display panels so as to expose a portion of each of the TFTs, forming an OLED over the insulating layer so as to be electrically connected to the TFT via the third through-hole in each of the OLED display panels, forming a sealant over the insulating layer in the non-display area of each of the OLED display panels, wherein each of the sealants is at least partially filled in the corresponding first and second through-holes so as to directly contact the corresponding dummy electrode, attaching a sealing substrate to the mother substrate, and performing a first heat treatment on the sealant in each of the OLED display panels.

The method further includes performing a second heat treatment on the sealant in the second non-display area of each of the OLED display panels and cutting the mother substrate to separate each of the OLED display panels. The dummy electrode can form a closed loop surrounding the display area in each of the OLED display panels. The first and second through-holes can have different sizes from each other. The area of a cross-section of the first through-hole can be greater than that of the second through-hole. Each of the second non-display areas can be formed adjacent to another OLED display panel and each of the first non-display areas can be formed adjacent to an edge of the mother substrate.

Another aspect is a method for fabricating an OLED display, the method including providing a first substrate including a display area in which an OLED is formed and a non-display area surrounding the display area, wherein the non-display area includes first and second non-display areas, forming a dummy electrode in the non-display area, forming an insulating layer over the dummy electrode, forming at least one first through-hole and at least one second through-hole so as to expose the dummy electrode, wherein the first and second through-holes are respectively formed in the first and second non-display areas, applying a sealant in the non-display area so as to surround the display area, wherein the sealant is at least partially filled in the first and second through-holes so as to directly contact the dummy electrode, attaching a second substrate to the first substrate, performing a first heat treatment on the sealant, and performing a second heat treatment on the sealant in the second non-display area.

The dummy electrode can form a closed loop surrounding the display area. The first and second through-holes can have different sizes from each other. The area of a cross-section of the first through-hole can be greater than that of the second through-hole. The at least one second through-hole can include a plurality of second through-holes and the second through-holes can be formed along a side of the first substrate. The sum of the height of each of the first and second through-holes and the height of the dummy electrode can be substantially the same as that of the insulating layer.

Another aspect is an OLED display including a first substrate including a display area and a non-display area surrounding the display area, wherein the non-display area includes first and second non-display areas, an insulating layer formed in the non-display area, a second substrate formed over the first substrate, and a sealant formed in the non-display area and substantially sealing the first and second substrates, wherein the insulating layer has at least one first through-hole and at least one second through-hole respectively formed in the first and second non-display areas, wherein the first through-hole has a greater area than the second through-hole, and wherein the sealant substantially fills the first and second through-holes.

The OLED display can further include a dummy electrode formed in the non-display area, wherein the dummy electrode directly contacts the sealant via the first and second through-holes. The first and second non-display areas can be formed on opposing sides of the first substrate. The width of the sealant can be greater than that of each of the first and second through-holes. The width of the dummy electrode can be greater than that of each of the first and second through-holes. The width of the of the dummy electrode can be substantially similar to that of the sealant.

DETAILED DESCRIPTION OF CERTAIN INVENTIVE EMBODIMENTS

Figure 1:
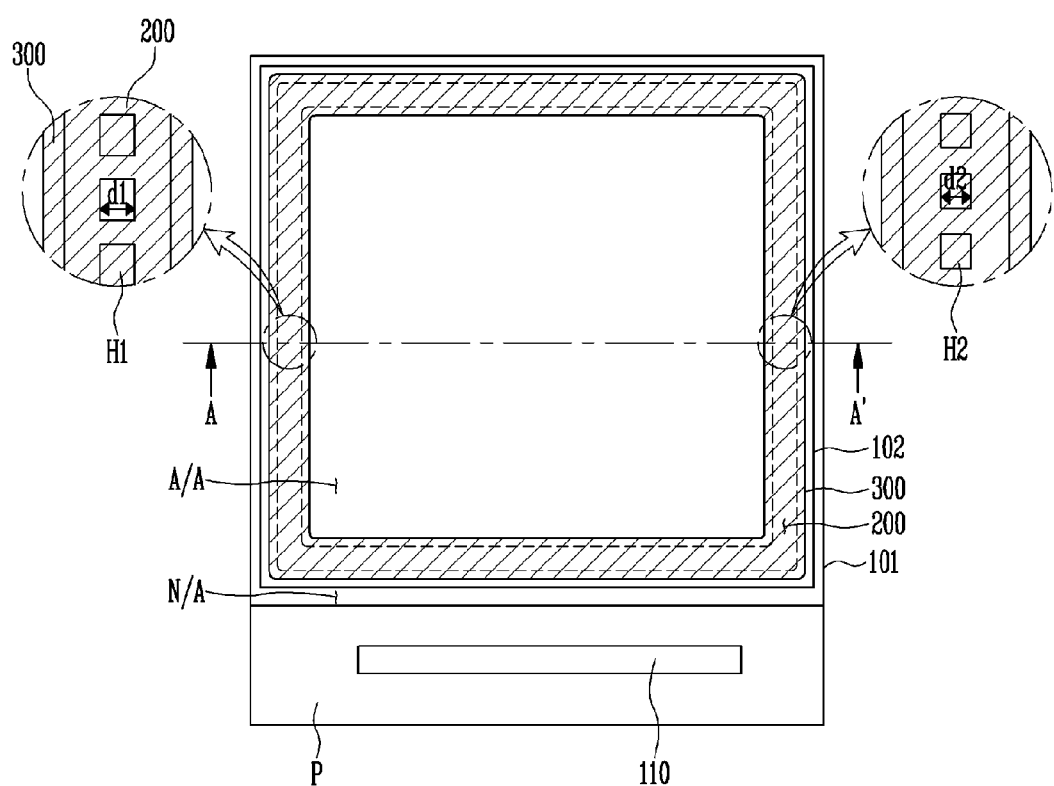
FIG. 1 is a plan view schematically illustrating an OLED display according to an embodiment.

OLED displays can degrade when exposed to external contaminants such as oxygen and moisture. In order to prevent this type of degradation, they are sealed using an inorganic sealant material such as a frit (typically made of glass). When using frit as the sealant, the space between a substrate and a sealing substrate can be completely sealed by curing melted frit, and thus it is unnecessary to use a moisture absorbing material. Such a configuration can be used to efficiently protect displays from environmental contaminations.

The standard method of applying a frit sealant in OLED displays includes melting the frit with laser or infrared irradiation followed by curing. Typically, the frit is applied in a thin film to four sides of a substrate and then melted by laser irradiation.

Hereinafter, certain exemplary embodiments will be described with reference to the accompanying drawings. Here, when a first element is described as being coupled to a second element, the first element may be not only directly coupled to the second element but may also be indirectly coupled to the second element via a third element. Further, some of the elements that are not essential to the complete understanding of the described technology are omitted for the sake of clarity. Also, like reference numerals refer to like elements throughout.

In the drawings, the thicknesses of layers, films, and regions may be exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. The term "substantially" as used in this disclosure means completely, almost completely, or to any significant degree.

Figure 2:
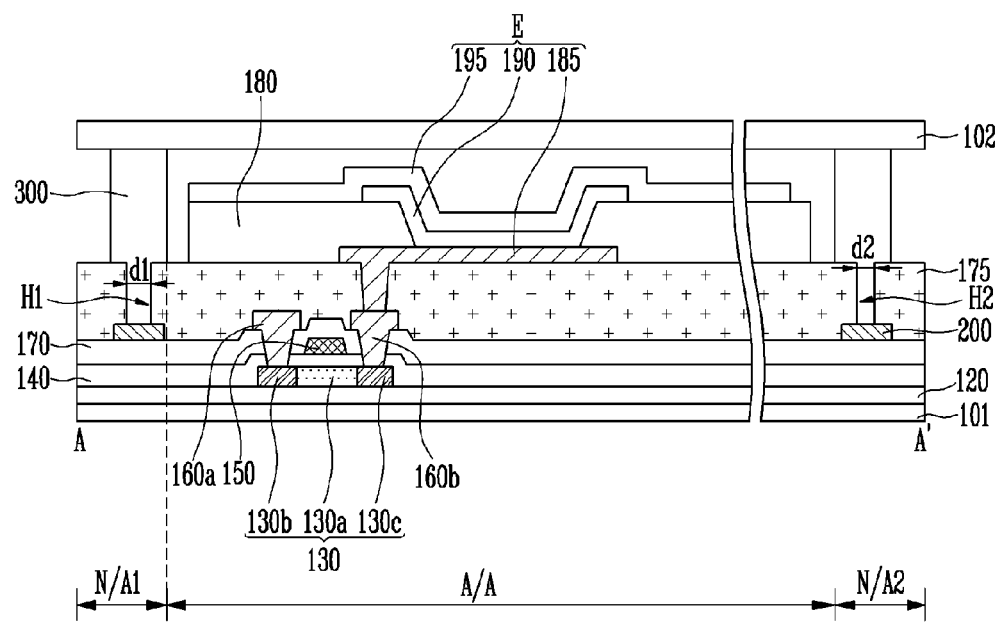
FIG. 2 is a sectional view taken along line A-A' of the OLED display of FIG. 1.

FIG. 1 is a plan view schematically illustrating an organic light-emitting diode (OLED) display according to an embodiment. FIG. 2 is a sectional view taken along line A-A' of the OLED display of FIG. 1.

Referring to FIGS. 1 and 2, the OLED display includes a first substrate 101 including a display area A/A and a non-display area N/A, and a second substrate 102 opposing the first substrate 101. In addition, the OLED display includes a sealing means or sealant 300 formed between the first and second substrates 101 and 102 and a dummy electrode 200 formed beneath the sealing means 300. Depending on the embodiment, the sealing means 300 can be formed as a sealant thin film or a sealant material.

The first and second substrates 101 and 102 may be formed of glass, but the described technology is not limited thereto. That is, the first and second substrates 101 and 102 may be substrates formed of metal or plastic.

The second substrate 102 has a smaller area than the first substrate 101, and accordingly, a portion of the first substrate 101 is exposed. A pad portion P that is formed in the exposed portion of the first substrate 101 corresponds to the non-display area N/A and includes a driving portion 110 such as an IC, and the like.

The first substrate 101 includes a buffer layer 120 and a semiconductor layer 130 formed on the buffer layer 120, the semiconductor layer 130 including an active layer 130a and source and drain regions 130b and 130c. The first substrate 101 also includes a first insulating layer 140 formed on the semiconductor layer 130 and a gate electrode 150 formed on one region of the first insulating layer 140, the gate electrode 150 having a size corresponding to the width of the active layer 130a. The first substrate 101 further includes a second insulating layer 170 formed on the gate electrode 150, source and drain electrodes 160a and 160b formed on the second insulating layer 170, and a third insulating layer 175 formed on the source and drain electrodes 160a and 160b.

The first substrate 101 further includes a first electrode 185 formed on the third insulating layer 175, a pixel defining layer 180 having an opening through which a region of the first electrode 185 is exposed, an organic emission layer 190 formed in the opening of the pixel defining layer 180, and a second electrode 195 formed on the pixel defining layer 180 and the organic emission layer 190.

The first and second electrodes 185 and 195, and the organic emission layer 190 formed therebetween constitute an OLED E.

The first or second substrate 101 or 102 can be appropriately selected from a transparent substrate such as glass, a quartz substrate, a ceramic substrate, a silicon substrate; a flexible substrate such as plastic; or the like according to the requirements of those skilled in the art. However, when the OLED display is a bottom emission type display, the first substrate 101 is, for example, formed of a transparent material.

The buffer layer 120 is formed on a front surface of the first substrate 101. The buffer layer 120 protects the semiconductor layer 130 formed in a subsequent process from the penetration of impurities such as alkali ions, which can be discharged from the first substrate 101. The buffer layer 120 also planarizes the surface of the first substrate 101. Depending on the embodiment, the buffer layer 120 can be omitted according to the type and process conditions of the first substrate 101.

The semiconductor layer 130 is formed on the buffer layer 120 and includes the active region 130a into which impurities are not injected, and the source and drain regions 130b and 130c formed by injecting p-type or n-type impurities on both sides of the active region 130a. The impurities can be selected based on the type of thin film transistor to be formed.

The first insulating layer 140 includes openings formed on the semiconductor layer 130 to expose portions of the respective source and drain regions 130b and 130c therethrough. The first insulating layer 140, for example, includes an inorganic insulating material having a single layer formed of a material selected from silicon oxide ($SiO_2$), silicon nitride (SiN) and silicon oxynitride (SiON), or a stacked layer including two or more layers selected from silicon oxide ($SiO_2$), silicon nitride (SiN), and silicon oxynitride (SiON).

The gate electrode 150 is formed to overlap the active region 130a of the semiconductor layer 130 on the first insulating layer 140.

The gate electrode 150 can be formed into a single-layered structure with a one or more material selected from the group of molybdenum (Mo), tungsten (W), aluminum neodymium (AlNd), titanium (Ti), aluminum (Al), silver (Ag) and alloys thereof, or can be formed into a double- or multi-layered structure with Mo, Al or Ag which are low-resistance materials in order to reduce wire resistance. That is, the gate electrode 150 may be formed by sequentially laminating conductive layers of a multi-layered structure in order to reduce the wire resistance. Specifically, the gate electrode 150 can have a multi-layered structure including Mo/Al/Mo, MoW/AlNd/MoW, Mo/Ag/Mo, Mo/Ag alloy/Mo, or Ti/Al/Mo.

The second insulating layer 170 is formed of an inorganic and/or organic insulating material on the gate electrode 150 and includes the openings through which the portions of the respective source and drain regions 130b and 130c are exposed.

The source and drain electrodes 160a and 160b are formed on the second insulating layer 170. The source and drain electrodes 160a and 160b are respectively electrically connected to the source and drain regions 130b and 130c through the openings formed in the first and second insulating layers 140 and 170.

The source and drain electrodes 160a and 160b may be formed into a single-layered structure with one or more material selected from the group of Mo, W, AlNd, Ti, Al, Ag, and alloys thereof, or be formed into a double- or multi-layered structure with Mo, Al, or Ag which are low-resistance materials in order to reduce wire resistance.

Like the source and drain electrodes 160a and 160b, the dummy electrode 200 is formed on the second insulating layer 170 and forms a rectangular closed loop surrounding the display area A/A in the non-display area N/A. In some embodiments, the dummy electrode 200 is formed of the same material and in the same layer as the source and drain electrodes 160a and 160b. In other embodiments, the dummy electrode 200 is formed of the same material as the gate electrode 150 on the first insulating layer 140.

The third insulating layer 175 is formed of an inorganic and/or organic insulating material on the dummy electrode 200 and the source and drain electrodes 160a and 160b and includes first and second through-holes H1 and H2 through which portions of the dummy electrode 200 are exposed. The third insulating layer 175 further includes a third through-hole H3 through which a portion of the drain electrode 160b is exposed.

The first and second through-holes H1 and H2 of the third insulating layer 175 are formed in the non-display area N/A and correspond to the dummy electrode 200.

The sealing means 300 includes a frit formed of a transparent material to substantially block the penetration of moisture and oxygen from the environment. The sealing means 300 is formed in an area corresponding to the dummy electrode 200 in the non-display area N/A and forms a rectangular closed loop surrounding the display area A/A of the first substrate 101.

Frit originally means a powder-type glass raw material including an additive. However, in the glass technical field, frit ordinarily means glass formed by melting the frit. Therefore, in this specification, the frit encompasses both a powder-type glass raw material including an additive and glass formed by melting such a material.

According to some embodiments, the sealing means 300 includes a glass material, an absorbent for absorbing laser irradiation, and a filler for reducing the thermal expansion coefficient thereof. The sealing means 300 is applied to the first and second substrates 101 and 120 opposite to each other in a frit paste state including an organic binder and seals the first and second substrates 101 and 102 after being melted using laser or infrared light and then cured.

In the embodiment of FIGS. 1 and 2, the sealing means 300 seals the first and second substrates 101 and 102 through laser irradiation.

The non-display area N/A can be divided into first and second non-display areas N/A1 and N/A2 according to the number of laser irradiation processes performed on the sealing means 300.

The second non-display area N/A2 refers to a portion of the OLED display bounded by other OLED displays on a mother substrate (not shown) and each OLED display is to be cut along the second non-display area N/A2.

That is, the second non-display area N/A2 refers to the portion of the non-display area along the boundary between two adjacent cells cut from a mother substrate.

Since the cutting is performed in the second non-display area N/A2, the sealing means 300 formed in the second non-display area N/A2 can be broken by stress generated during the cutting process. In order to prevent such a problem, the sealing means 300 formed in the second non-display area N/A2 is heat-treated with laser irradiation twice.

That is, the sealing means 300 formed in the first non-display area N/A1 is heat-treated with a single laser irradiation process and the sealing means 300 formed in the second non-display area N/A2 is heat-treated with two laser irradiation processes.

In FIG. 2, the first non-display area N/A1 is illustrated as the left non-display area of the OLED display and the second non-display area N/A2 is illustrated as the right non-display area. The first and second through-holes H1 and H2 of the third insulating layer 175 are respectively formed in the first and second non-display areas N/A1 and N/A2.

The first and second through-holes H1 and H2 respectively formed in the first and second non-display areas N/A1 and N/A2 allow portions of the dummy electrode 200 formed therebeneath to be respectively exposed therethrough. The exposed dummy electrode 200 contacts the sealing means 300 via the first and second through-holes H1 and H2.

Although the first and second through-holes H1 and H2 are formed in the shape of a rectangle in FIG. 1, the described technology is not limited thereto. That is, according to other embodiments, the first and second through-holes H1 and H2 have the shape of a polygon, a regular square, a circle, an ellipse, or the like.

Since the dummy electrode 200 contacted with the sealing means 300 is formed of a metal material, the dummy electrode 200 has a high thermal conductivity and can assist in transferring heat generated when laser is irradiated onto the sealing means 300. Therefore, the sealing means 300 including the frit has an increased spreadability due to the heat received from the dummy electrode and the width of the sealing means 300 can be increased.

The first and second through-holes H1 and H2 of the third insulating layer 175 have different widths from each other. In the FIG. 2 embodiment, the width d1 of the first through-hole H1 is greater than that d2 of the second through-hole H2. According to some embodiments, the ratio of the areas of the first and second through-holes H1 and H2 is about 8% to about 10% and the power of laser irradiated onto the sealing means 300 is about 13.5 W. However, in other embodiments, the ratio of the areas of the first and second through-holes H1 and H2 is less than about 8 or greater than about 10% and the power of laser irradiated onto the sealing means 300 is less than or greater than about 13.5 W.

Since the width of the first through-hole H1 is greater than that of the second through-hole H2, the contact area between the dummy electrode 200 and the sealing means 300 in the first non-display area N/A1 is greater than between the dummy electrode 200 and the sealing means 300 in the second non-display area N/A2.

Therefore, after being irradiated with the laser in each of the sealing means 300 formed in the first and second non-display areas N/A1 and N/A2, the width of the sealing means 300 in the first non-display area N/A1, which has a wide contact area with the dummy electrode 200, is greater than that of the sealing means 300 in the second non-display area N/A2. Consequently, the sealing means 300 formed in the non-display area N/A has different widths in the first and second non-display areas N/A1 and N/A2.

As described above, the second non-display area N/A2 is adjacent to where the cutting is performed on the mother substrate and laser irradiation is performed twice on the second non-display area N/A2. If the laser is additionally irradiated onto only the sealing means 300 formed in the second non-display area N/A2, the width of the sealing means 300 may be increased by the heat of the second irradiation process.

Thus, the width of the sealing means 300 formed in the first non-display area N/A1 is similar to that of the sealing means formed in the second non-display area N/A2, so that the sealing means 300 formed in the non-display area N/A of the OLED display can have a substantially uniform sealing width.

As described above, according to at least one embodiment, in the OLED display, although the number of laser irradiations performed on the sealing means 300 formed in the first non-display area N/A1 is different from the number performed on the sealing means 300 formed in the second non-display area N/A2, the contact area between the dummy electrode 200 and the sealing means 300 formed in the first non-display area N/A1 is different from that between the dummy electrode 200 and the sealing means 300 formed in the second non-display area N/A2, and thus the sealing means 300 is formed to have a substantially uniform sealing width.

Hereinafter, a fabrication method of the OLED display according to an embodiment will be described in detail.

FIGS. 3 to 8 are sectional views sequentially illustrating a fabrication process of the OLED display of FIG. 2.

Figure 3:
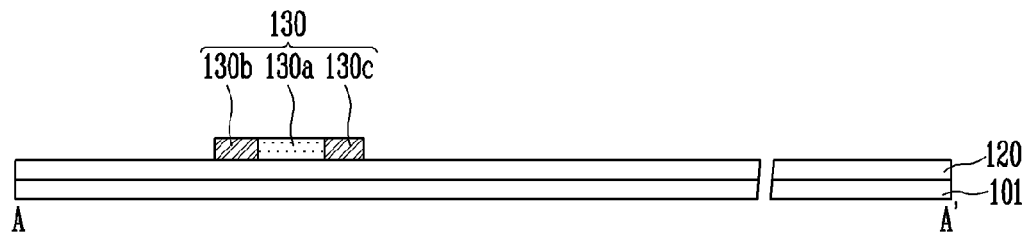
FIGS. 3 to 8 are sectional views sequentially illustrating a fabrication process of the OLED display of FIG. 2.

First, referring to FIG. 3, a buffer layer 120 is formed on a first substrate 101 formed of glass, plastic, etc. through chemical vapor deposition, plasma enhanced chemical vapor deposition, or the like. The buffer layer 120 may be formed of an insulating material including an oxide, such as silicon oxide ($SiO_2$), aluminum oxide ($Al_2O_3$), hafnium oxide ($HfO_3$) or yttrium oxide ($Y_2O_3$).

Subsequently, a semiconductor layer 130 is formed on the first substrate 101 having the buffer layer 120 formed thereon.

The semiconductor layer 130 includes an active region 130a, and source and drain regions 130b and 130c respectively formed on opposing sides of the active region 130a.

Figure 4:
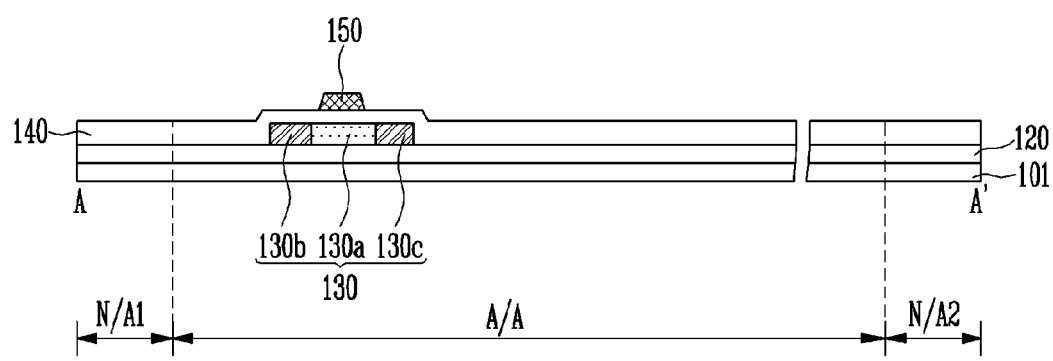

Next, referring to FIG. 4, a first insulating layer 140 is formed on the first substrate 101 having the semiconductor layer 130 formed thereon. The first insulating layer 140 may be formed with a single layer including an electrically insulating oxide such as silicon oxide (SiOx), or be formed with multiple layers having a lower layer including an electrically insulating material such as silicon oxide (SiOx) and an upper layer including an insulating material.

A gate electrode 150 is then formed by forming a conductive material layer such as metal on the first insulating layer 140 and patterning the conductive material layer. The gate electrode 150 substantially overlaps the active region 130a.

Figure 5:
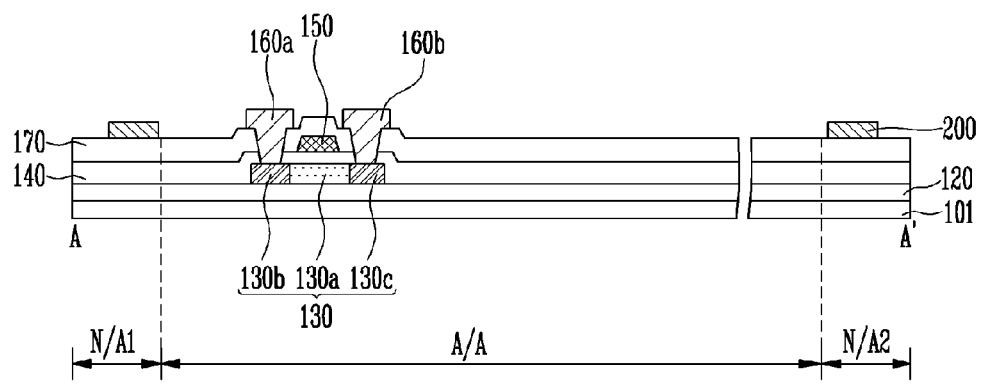

Next, referring to FIG. 5, a second insulating layer 170 is formed on the first substrate 101 having the gate electrode 150 formed thereon, the first substrate 101 being divided into a display area A/A and first and second non-display areas N/A1 and N/A2.

Subsequently, the first and second insulating layers 140 and 170 are patterned so that portions of the source and drain regions 130b and 130c are exposed.

Source and drain electrodes 160a and 160b are formed to be respectively electrically connected to the exposed source and drain regions 130b and 130c. Simultaneously, a dummy electrode 200 formed of the same material as the source and drain electrodes 160a and 160b is formed on the first substrate 101.

The source and drain electrodes 160a and 160b are formed in the display area A/A of the first substrate 101 and the dummy electrode 200 is formed in each of the first and second non-display areas N/A1 and N/A2.

Figure 6:
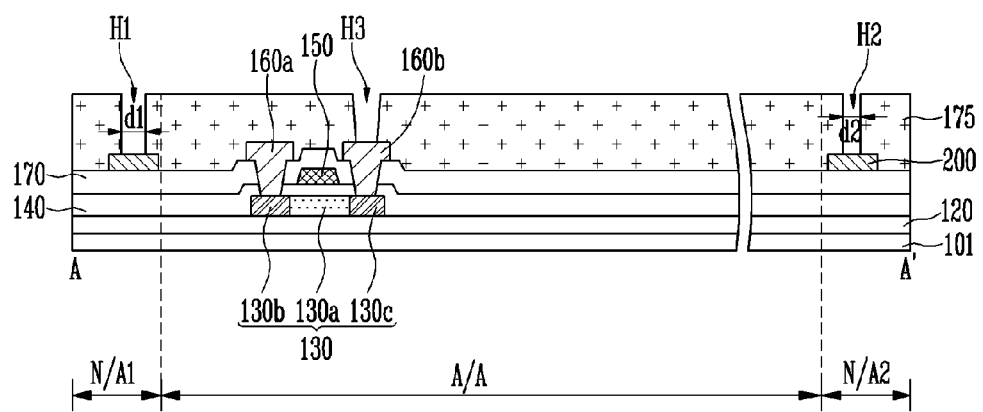

Next, referring to FIG. 6, a third insulating layer 175 is formed on the first substrate 101 on which the dummy electrode 200 and the source and drain electrodes 160a and 160b are formed. The third insulating layer 175 is patterned to include first and second through-holes H1 and H2 through which portions of the dummy electrodes 200 formed in the respective first and second non-display areas N/A1 and N/A2 are exposed and a third through-hole H3 through which a portion of the drain electrode 160b is exposed.

The third insulating layer 175 is patterned so that the width d1 of the first through-hole H1 is greater than that d2 of the second through-hole H2 and the area ratio of the first and second through-holes H1 and H2 is about 8% to about 10%.

Figure 7:
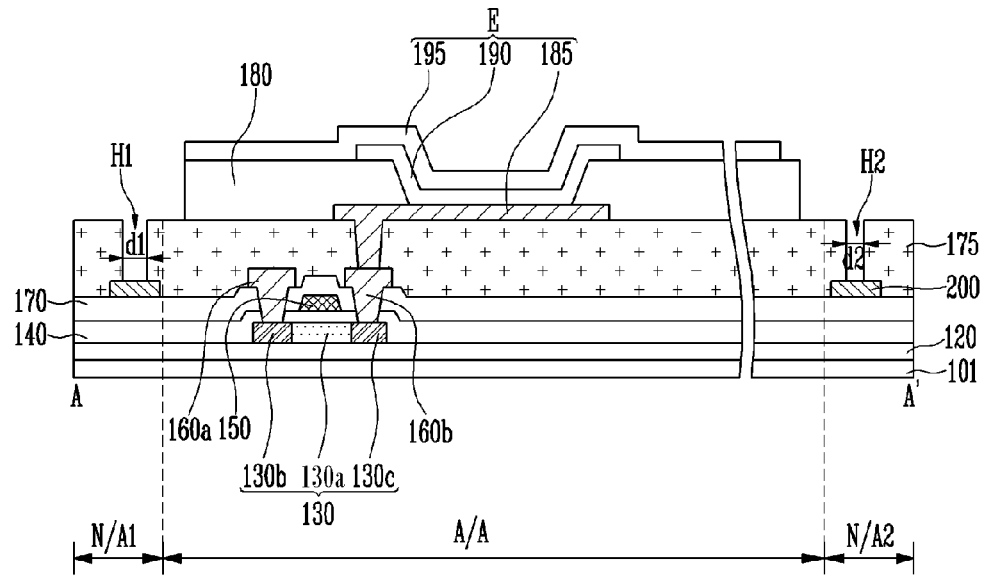

Next, referring to FIG. 7, a first electrode 185 electrically connected to the drain electrode 160b through third through-hole H3 is formed on the first substrate 101 having the third insulating layer 175 formed thereon. The first electrode 185 is an anode electrode of an OLED E and can be formed of an inorganic layer material.

A pixel defining layer 180 is formed on the third insulating layer 175 having the first electrode 185 formed thereon.

The pixel defining layer 180 includes an opening through which a portion of the first electrode 185 is exposed through a photo process. The pixel defining layer 180 may be formed of an organic layer material selected from the group of polyacryl-based resin, epoxy resin, phenol resin, polyamide-based resin, polyimide-based resin, unsaturated polyester-based resin, and benzocyclobutene.

An organic emission layer 190 is formed in the opening of the pixel defining layer 180 and a second electrode 195 is formed on the organic emission layer 190.

The first and second electrodes 185 and 195 and the organic emission layer 190 formed therebetween constitute the OLED E.

A low or high molecular organic layer can be used as the organic emission layer 190. When the low molecular organic layer is used, the organic emission layer 190 can be formed by stacking, into a single- or multi-layered structure, a hole injection layer (HIL), a hole transport layer (HTL), an emission layer, an electron transport layer (ETL), an electron injection layer (EIL), and the like.

The second electrode 195 acts as a cathode electrode of the OLED E and the polarities of the first and second electrodes 185 and 195 can be reversed.

When the OLED display is a bottom emission type display in which images are displayed in the direction of the first substrate 101, the first electrode 185 is a transparent electrode and the second electrode 195 is a reflective electrode. In these embodiments, the first electrode 185 can be formed of ITO, IZO or $In_2O_3$ having a high work function and the second electrode 195 can be formed of a metal having a low work function, i.e., Ag, Mg, Al, Pt, Pd, Au, Ni, Ir, Nd, Cr, Li, Ca or the like.

When the OLED display is a top emission type display in which images are displayed in the direction of the second electrode 195, the first electrode 185 is a reflective electrode and the second electrode 195 is as a transparent electrode. In these embodiments, the reflective electrode, that it, the first electrode 185 can be formed to include a reflective layer formed of Ag, Mg, Al, Pt, Pd, Au, Ni, Nd, Ir, Cr, Li, Ca or compound thereof, and ITO, IZO, ZnO or $In_2O_3$ having a high work function. The transparent electrode, that is, the second electrode 195 can be formed by depositing a metal having a low work function and then an auxiliary electrode layer or a bus electrode line, using a transparent conductive material such as ITO, IZO, ZnO or $In_2O_3$.

When the OLED display is a dual surface-emission type OLED display, both the first and second electrodes 185 and 195 can be provided as transparent electrodes.

The first and second electrodes 185 and 195 are not necessarily formed of the above described materials, and can be formed of a conductive organic material or a conductive paste including conductive particles such as Ag, Mg or Cu. When the conductive paste is used, printing may be performed using an inkjet printing method and the conductive paste can be formed as an electrode by performing heat treatment after the printing.

Figure 8:
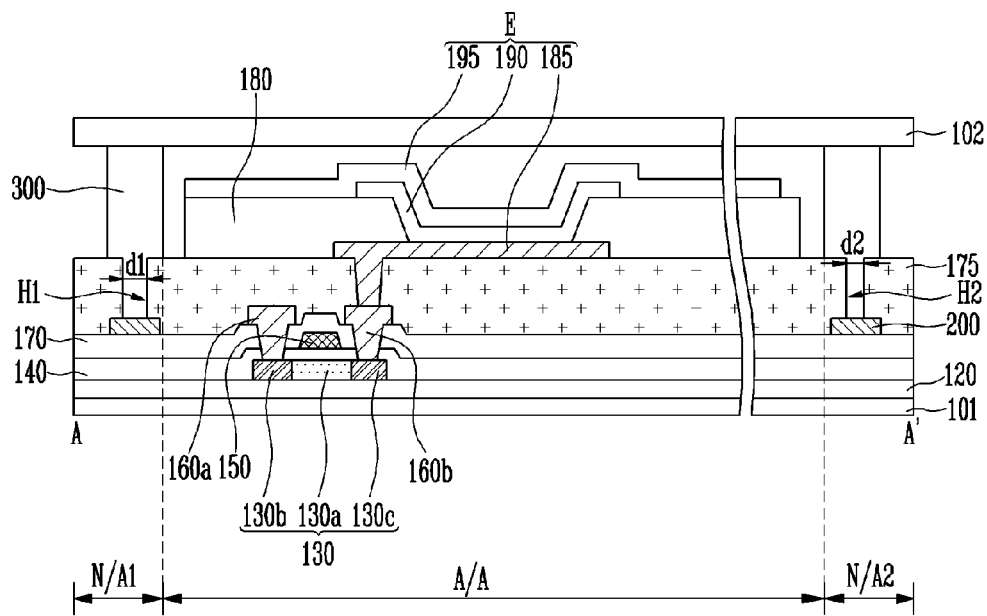

Next, referring to FIG. 8, a sealing means 300 is applied to the first and second non-display areas N/A1 and N/A2 of the first substrate 101 having the OLED E formed thereon. Subsequently, a second substrate 102 joined together with the first substrate 101 via the sealing means 300 and is formed above the first substrate 101 to which the sealing means 300 is applied.

The sealing means 300 contacts the dummy electrodes 200 through the first and second through-holes H1 and H2 formed in the third insulating layer 175 in the first and second non-display areas N/A1 and N/A2.

Since the width of the first through-hole H1 is greater than that of the second through-hole H2, the contact area between the dummy electrode 200 and the sealing means 300 in the first non-display area N/A1 is greater than that between the dummy electrode 200 and the sealing means 300 in the second non-display area N/A2.

The first and second substrates 101 and 102 are joined together by irradiating laser light onto the sealing means 300 contacting the dummy electrodes 200 in the first and second non-display areas N/A1 and N/A2 and melting the sealing means 300.

Subsequently, the sealing means 300 formed in the second non-display area N/A2 is melted in an additional laser irradiation process onto only the sealing means 300 formed in the second non-display area N/A2.

The width of the sealing means 300 having a large contact area with the dummy electrode 200 in the first non-display area N/A1 is similar to that of the sealing means 300 in the second non-display area N/A2 after the two step laser irradiation process is performed on the second non-display area N/A2. Thus, according to at least one embodiment, it is possible to implement the sealing means 300 having a substantially uniform sealing width in the OLED display.

The fabrication method described above applies to a method of fabricating a single OLED display and to fabricating a plurality of OLED displays divided into cells on a mother substrate such as typically done for the purpose of commercialization. This will be described with reference to FIGS. 9 to 12.

FIGS. 9 to 12 illustrate a process of fabricating the OLED display from a mother substrate according to an embodiment.

Figure 9:
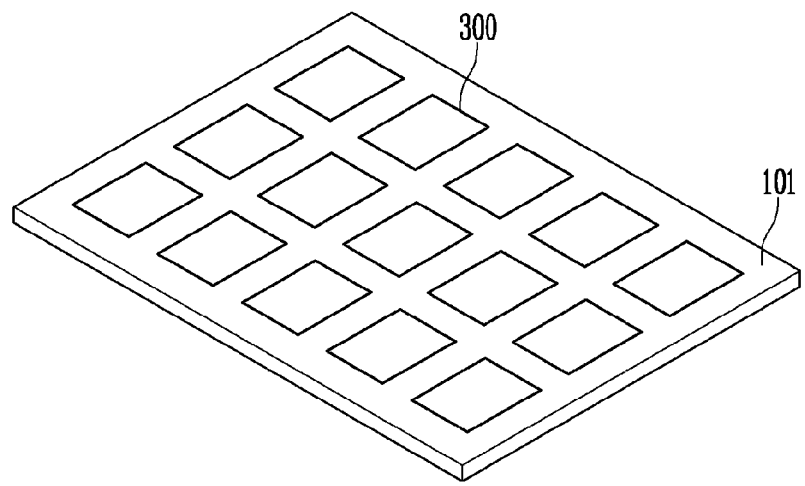
FIGS. 9 to 12 illustrate a process of fabricating the OLED display from a mother substrate according to an embodiment.

First, referring to FIG. 9, a sealing means 300 is applied on a first substrate 101 to form a plurality of cells (OLED displays) at a predetermined interval. In some embodiments, the sealing means 300 includes a glass frit.

Subsequently, the sealing means 300 applied on the first substrate 101 is heat-treated at a temperature of about 300° C. to about 500° C.

Figure 10:
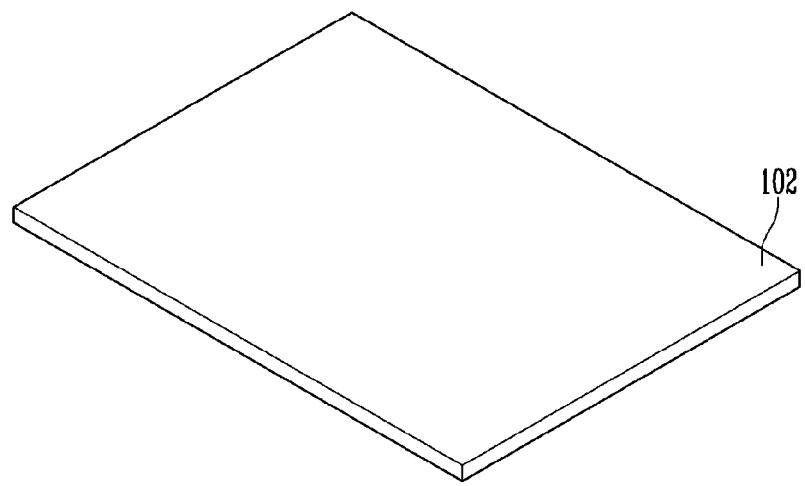
Figure 10:
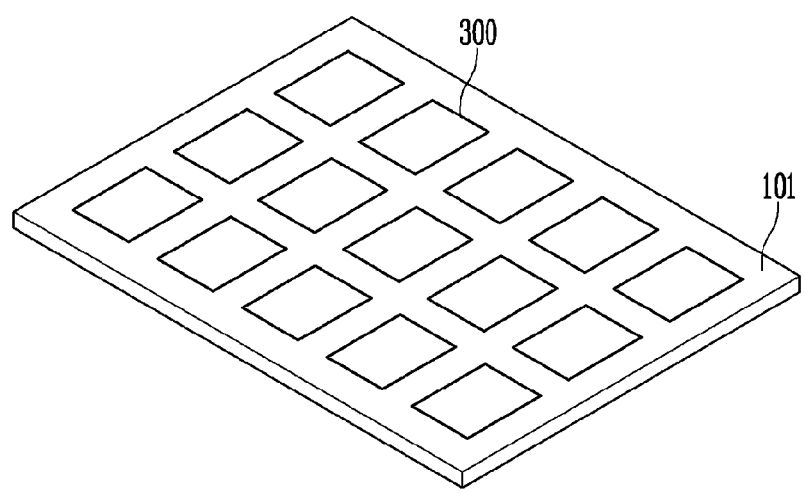

Next, referring to FIG. 10, the first substrate 101 having the heat-treated sealing means 300 thereon is joined together with a separately prepared second substrate 102.

Figure 11:
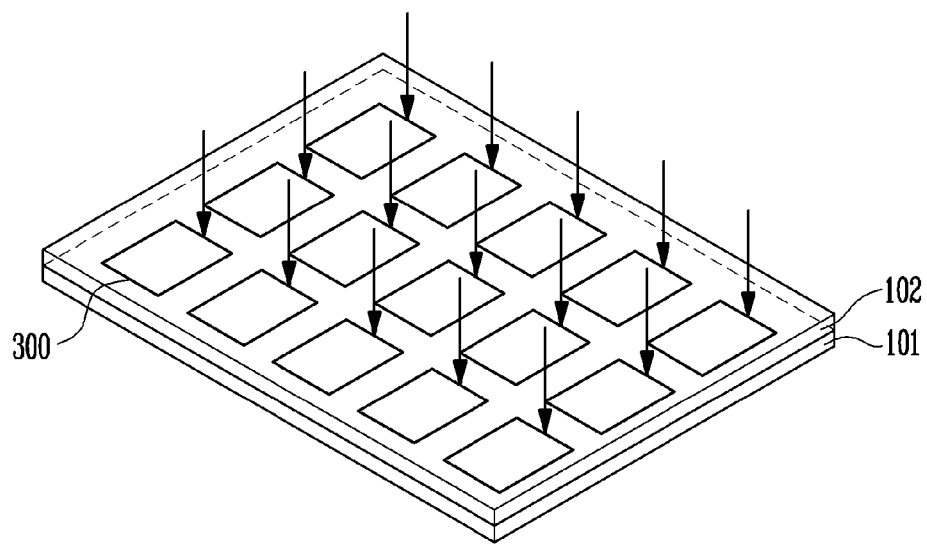

Next, referring to FIG. 11, the first and second 101 and 102 are joined together by irradiating laser onto the sealing means 300 formed between the first and second substrates 101 and 102. According to some embodiments, the wavelength of the irradiated laser light is about 800 nm to about 1200 nm, and the power of the irradiated laser is about 13.5 W. The other areas excluding the sealing means 300 are masked.

Subsequently, the sealing means 300 melted by the laser irradiation is heat-treated by additional laser irradiation in specific areas of the first substrate 101. The specific areas of the first substrate 101 are the boundaries between adjacent cells among the plurality of cells, which have a narrow interval between the sealing means 300 and are cut in a subsequent process.

Figure 12:
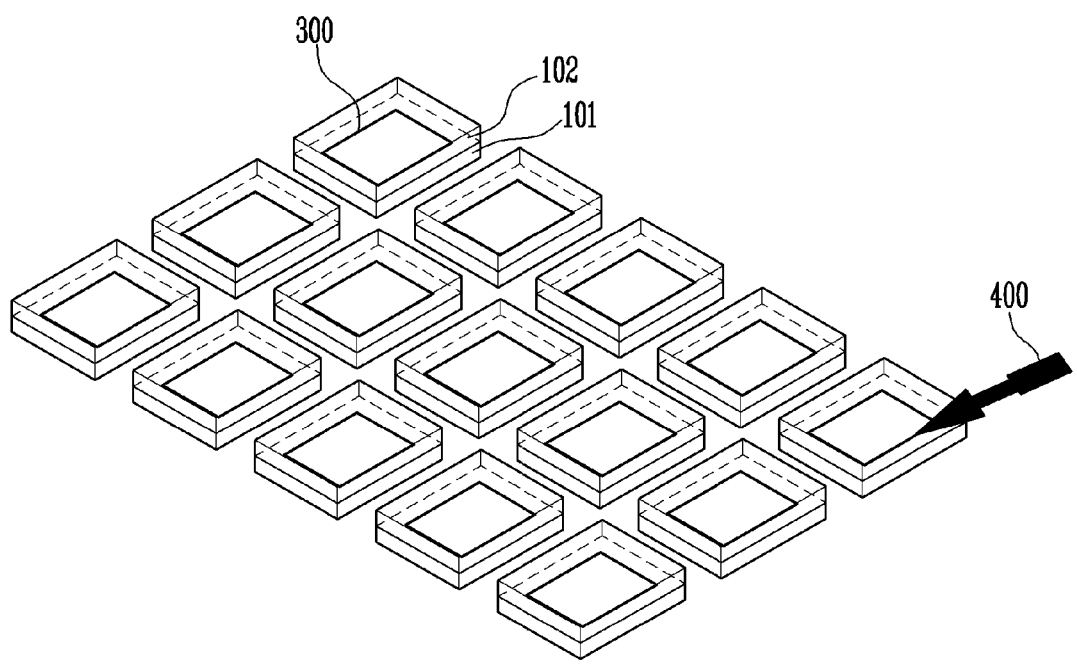

Next, referring to FIG. 12, the first and second substrates 101 and 102 joined together by the sealing means 300 are cut by a cutting device 400 to separate each individual OLED display.

By way of summation and review, OLED displays can be fabricated in the form of a plurality of cells on a mother substrate and then can be divided into single cells. When a cutting process is performed on the mother substrate, defects can occur near where the cutting process is performed (a portion having a narrow interval between frits) due to stress caused by the cutting.

In order to minimize the above defect, laser light is irradiated onto the frit for a second time in the areas where the cutting process is performed, thereby performing a two-time heat treatment process.

The frit subjected to the two-time heat treatment is melted by heat generated in the laser irradiation, so that the width of the frit becomes wider than that of a frit subjected to a one-time heat treatment. Therefore, the frit applied to the four sides of a substrate has a different width based on its location.

Accordingly, it is desirable to have an OLED display with a substantially uniform sealing width regardless of the location of the seal.

In the OLED display and the fabrication method for the same according to at least one embodiment, the dummy electrode corresponding to the sealing means is formed in the non-display area and the contact area between the dummy electrode and the sealing means is varied for each non-display area by exposing portions of the dummy electrode, so that it is possible to form the sealing with a substantially uniform width, regardless of the number of laser irradiations performed on the non-display area.

Example embodiments have been disclosed herein, and although specific terms have been employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the invention as set forth in the following claims.

What is claimed is:

1. An organic light-emitting diode (OLED) display, comprising:
   a first substrate including a display area and a non-display area surrounding the display area, wherein the non-display area includes first and second non-display areas;
   a second substrate formed over the first substrate;
   a dummy electrode formed in the non-display area;
   an insulating layer formed over the dummy electrode; and
   a sealant substantially sealing the first and second substrates and formed over the insulating layer in the non-display area;
   wherein the insulating layer has at least one first through-hole and at least one second through-hole respectively formed in the first and second non-display areas opposing each other, wherein the diameters of the first and second through-holes are different, and wherein the sealant is at least partially filled in the first and second through-holes so as to directly contact the dummy electrode.

2. The OLED display of claim 1, wherein the dummy electrode forms a closed loop surrounding the display area.

3. The OLED display of claim 1, wherein the area of a cross-section of the first through-hole is greater than that of the second through-hole.

4. The OLED display of claim 1, wherein the at least one second through-hole comprises a plurality of second through holes and wherein the second through-holes are formed along a side of the first substrate.

5. The OLED display of claim 4, wherein the first and second non-display areas are formed on opposing sides of the first substrate.

6. The OLED display of claim 1, wherein the sealant has a uniform width.

7. The OLED display of claim 1, wherein the OLED display is included in a mother substrate that includes additional OLED displays adjacent to the OLED display, and wherein the first and second non-display areas of the OLED display are subject to different numbers of laser irradiation.

8. An organic light-emitting diode (OLED) display, comprising:
   a first substrate including a display area and a non-display area surrounding the display area, wherein the non-display area includes first and second non-display areas;
   an insulating layer formed in the non-display area;
   a second substrate formed over the first substrate; and
   a sealant formed in the non-display area and substantially sealing the first and second substrates,
   wherein the insulating layer has at least one first through-hole and at least one second through-hole respectively formed in the first and second non-display areas formed on opposing sides of the first substrate,
   wherein the first through-hole has a greater area than the second through-hole, and
   wherein the sealant substantially fills the first and second through-holes.

9. The OLED display of claim 8, further comprising a dummy electrode formed in the non-display area, wherein the dummy electrode directly contacts the sealant via the first and second through-holes.

* * * * *